(12) United States Patent
Tarleton (10) Patent No.: US 9,356,578 B1
(45) Date of Patent: May 31, 2016

(54) SPURIOUS FREQUENCY ATTENUATION SERVO WITHOUT TUNING FILTER

(71) Applicant: Honeywell International Inc., Morristown, NJ (US)

(72) Inventor: Norman Gerard Tarleton, Glendale, AZ (US)

(73) Assignee: Honeywell International Inc., Morris Plains, NJ (US)

( * ) Notice: Subject to any disclaimer, the term of this patent is extended or adjusted under 35 U.S.C. 154(b) by 0 days.

(21) Appl. No.: 14/565,467

(22) Filed: Dec. 10, 2014

(51) Int. Cl.
*H03L 5/00* (2006.01)
*H03H 11/24* (2006.01)
*H03K 3/013* (2006.01)

(52) U.S. Cl.
CPC ............... *H03H 11/24* (2013.01); *H03K 3/013* (2013.01)

(58) Field of Classification Search
CPC .................. H01L 2924/0002; H01L 2924/00; H03H 11/1291
See application file for complete search history.

(56) References Cited

U.S. PATENT DOCUMENTS

| 7,869,052 | B2 | 1/2011 | Strandjord |
| 8,077,322 | B2 | 12/2011 | Strandjord et al. |
| 8,269,480 | B2 | 9/2012 | Max et al. |
| 2014/0211210 | A1 | 7/2014 | Croker et al. |
| 2014/0294117 | A1* | 10/2014 | Tarleton ............ G06F 1/022 375/296 |

OTHER PUBLICATIONS

Analog Devices, "Step-By-Step Overview of Spurkiller Technique", Mar. 3, 2005, pp. 1-11.
Reinhardt, "Spur Reduction Techniques in Direct Digital Synthesizers", "Proceedings of the 1993 International Frequency Control Symposium", 1993, pp. 2-12, Publisher: IEEE, Published in: Los Angeles, CA.

* cited by examiner

*Primary Examiner* — Sibin Chen
(74) *Attorney, Agent, or Firm* — Fogg & Powers LLC (57) ABSTRACT

A spurious frequency attenuation servo comprises a first signal generated at a first frequency including at least one spur at at least one respective spurious frequency (spur). The signal is filtered by a first fixed filter. A single sideband (SSB) mixer is configured to output a SSB output signal that comprises a difference of frequencies of an output of the first fixed filter mixed with another signal. The SSB output signal includes a direct current component and the spur, and is received by a second fixed filter, which filters out the SSB output signal and outputs the spur. At least one spur attenuation controller is configured to accumulate error after reading an error term in the spur and to keep integrating until the error term is driven to zero. At least one spur killer is configured to remove the spur when the error term is driven to zero.

20 Claims, 9 Drawing Sheets

FIG. 7

SPURIOUS FREQUENCY ATTENUATION SERVO WITHOUT TUNING FILTER

BACKGROUND

Harmonic distortion in the modulation source causes bias instability in the resonator fiber optics gyro (RFOG) system. Spurs generated at different harmonics of the fundamental frequency can cause problems. These spurs and harmonics need to be attenuated.

Prior art systems reduced these unwanted spurs by manually adjusting the phase and amplitude of any signal to cancel the spur or by using a method of attenuating these spurs by requiring a filter to be tuned to the fundamental frequency being outputted and then generating a frequency equal to the harmonic or the spur being attenuated.

SUMMARY

Example embodiments described herein provide for a spurious frequency attenuation servo that comprises a first function generator that generates a first signal at a first frequency, where the first signal includes at least one spur at at least one respective spurious frequency. The spurious frequency attenuation servo also comprises a first fixed filter that receives the first signal. A single sideband (SSB) mixer is coupled to the first fixed filter to receive an output of the first fixed filter. The SSB mixer is further configured to output a SSB output signal that includes the at least one spur at the at least one respective spurious frequency and the SSB output comprises one of a sum and a difference of frequencies of the output of the first filter and another signal mixed with the output of the first filter. A second fixed filter receives the SSB output signal including a direct current component and the at least one spur at at least one respective spurious frequency, and the second fixed filter is further configured to filter the SSB output signal and output the at least one spur at the at least one respective spurious frequency. The spurious frequency attenuation controller further comprises at least one spur attenuation controller that is configured to accumulate error after reading an error term in the at least one spur at the at least one respective spurious frequency and to keep integrating until the error term is driven to zero. The spurious attenuation servo also comprises at least one spur killer configured to remove the at least one spur at the at least one respective spurious frequency when the error term is driven to zero.

DRAWINGS

Understanding that the drawings depict only exemplary embodiments and are not therefore to be considered limiting in scope, the exemplary embodiments will be described with additional specificity and detail through the use of the accompanying drawings, in which.

In accordance with common practice, the various described features are not drawn to scale but are drawn to emphasize specific features relevant to the exemplary embodiments.

DETAILED DESCRIPTION

In the following detailed description, reference is made to the accompanying drawings that form a part hereof, and in which is shown by way of illustration specific illustrative embodiments. However, it is to be understood that other embodiments may be utilized and that logical, mechanical, and electrical changes may be made. Furthermore, the method presented in the drawing figures and the specification is not to be construed as limiting the order in which the individual steps may be performed. The following detailed description is, therefore, not to be taken in a limiting sense.

The embodiments of the spurious frequency attenuation servo described herein generate a cancellation signal without requiring a tuning filter or generating a matching spur frequency. The term "spur" referred to herein also means "unwanted frequency." The spurious frequency attenuation servo described herein cancels harmonics as well as other unwanted frequencies of a signal generated by a function generator. The embodiments of the spurious frequency attenuation servo described herein use a single sideband (SSB) mixer in combination with a fixed filter to attenuate the fundamental signal such that the generated spurs become available for amplification and cancellation.

Figure 1:
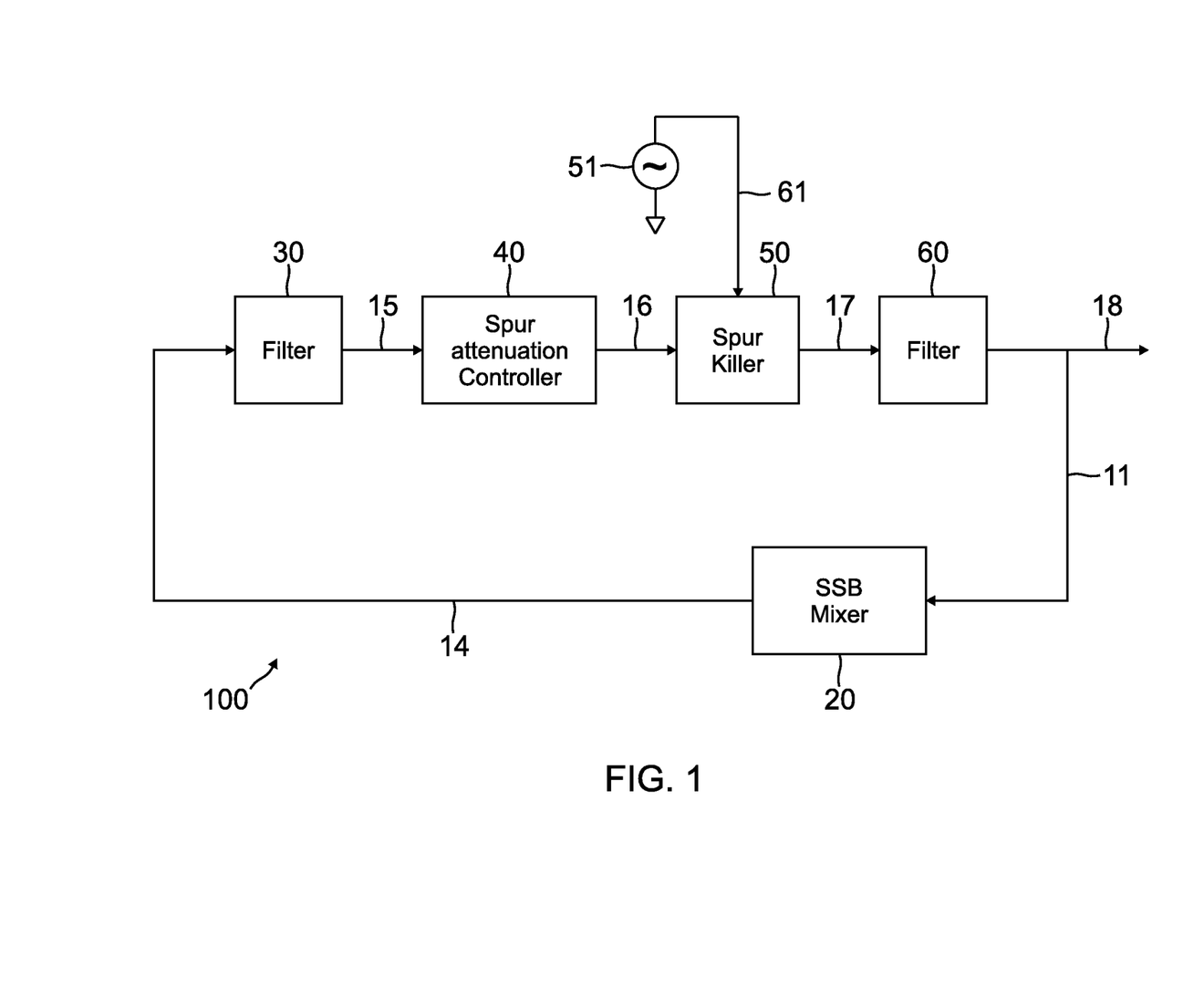
FIG. 1 is an exemplary embodiment of a spurious frequency attenuation servo.

FIG. 1 is an example of one embodiment of a spurious frequency attenuation servo (attenuation servo) 100. FIG. 1 is described in respect to canceling one spur that is generated by a function generator along with the main signal. The attenuation servo 100 includes a single sideband (SSB) mixer 20, a first filter 60, a spur attenuation controller 40, a spur killer 50, and a second filter 30. The attenuation servo also includes a first function generator 51 that generates a first signal 61. In one implementation of this embodiment, the first function generator 51 is included within the spur killer 50 of the attenuation servo 100.

Unlike the filters implemented in conventional spur attenuation servos, the first filter 60 and the second filter 30 in this embodiment does not have to be tuned. In one implementation of this embodiment, the second filter 30 is a fixed low frequency high pass filter (LF-HPF). In a low frequency high pass filter, the filter allows all frequencies above a certain cut off frequency to pass. The low frequency in a LF-HPF refers to where this cut off frequency is. That is, the cut off frequency is a relatively low frequency as determined by the specific system. In a fixed LF-HPF, this cut off frequency does not vary. In other implementations of this embodiment, the second filter 30 is another type of filter, for example, a band pass filter or a low pass filter. Similarly, in one embodiment, the first filter 60 is a fixed high frequency low pass filter (HF-LPF). In a HF-LPF, the filter filters out all of the frequencies above a certain cut off point and allows the frequencies below the cut off frequency to pass. The high frequency in a HF-LPF refers to where the cut off frequency is. In a fixed HF-LPF, this cut off frequency does not vary. In yet other implementations, the first filter 60 is another type of filter, for example, a band pass filter or a high pass filter.

A function generator generates a first signal at a first frequency, which includes at least one spur at a frequency other than the first frequency at which the first signal is generated. As defined herein, a spur is an unwanted signal generated at an unwanted frequency within a generated signal. In one implementation of this embodiment, the first signal includes more than one spur, each spur generated is at a respective spurious frequency differing from the first frequency. In one implementation of this embodiment, the spur killer 50 includes the first function generator, as described in more detail below with respect to FIG. 4.

As shown in FIG. 1, in one implementation, a first signal 61 generated by a first function generator 51 goes through the first filter 60. First filter 60 filters out the signal and sends it to the SSB mixer 20. The SSB mixer 20 mixes the signal with another signal and sends it through a summing node to output a desired sideband of the first signal. In one implementation of this embodiment, the output is a direct current (DC) signal with at least one spur. The output of the SSB mixer, signal 14 is sent into a second filter 30. In one implementation of this embodiment, the second filter 30 filters out signal 14 so that the output signal 15 only includes the spurs generated at their respective spurious frequencies. Spur attenuation controller 40 mixes signal 15 with desired signals generated by additional function generators. Additionally, spur attenuation controller 40 accumulates the error term in signal 15 and keeps integrating until the error term is driven to zero. The output from the spur attenuation controller 40, signal 16, is received by spur killer 50. Spur killer 50 yields a correction signal that is sent back into SSB mixer 20 through first fixed filter 60 and the process described in FIG. 1 is repeated until the error term in signal 15 has been driven to zero and unwanted spur at the respective spurious frequency is eliminated. The signal output from the first fixed filter 60 is sent back into the SSB mixer as signal 11 and is also output out to the system as signal 18.

Figure 5A:
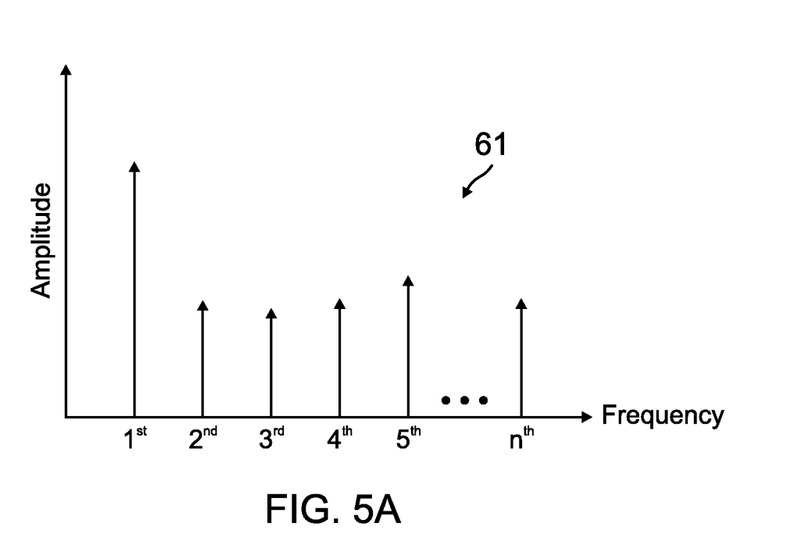
FIG. 5A shows frequencies of a first signal prior to operation of spurious attenuation servo on the first signal.
Figure 5B:
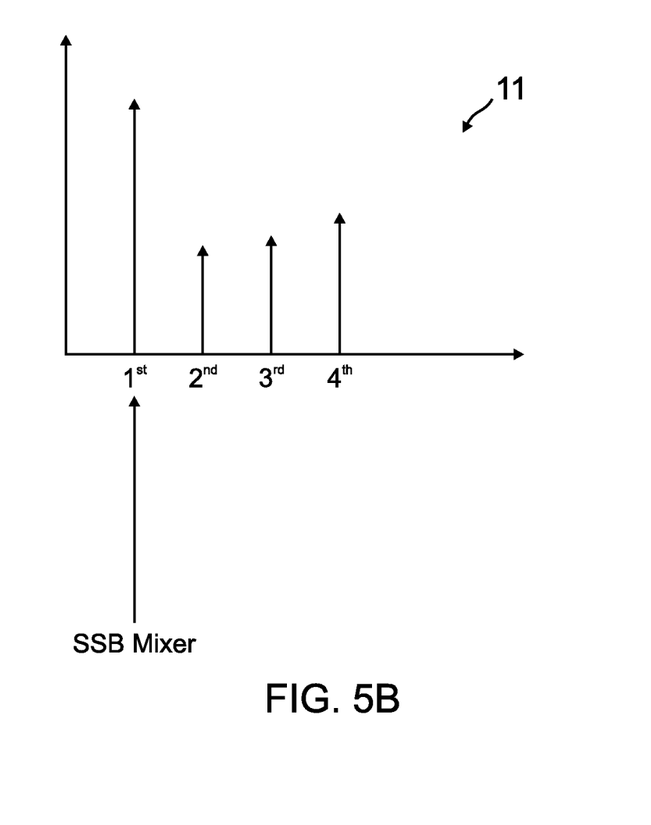
FIGS. 5B-5E show the frequency of the first signal from FIG. 5A after operation of embodiments of the spurious frequency attenuation servo on the first signal.

FIG. 5A shows exemplary frequencies contained in the first signal 61 prior to the operation of servo 100. In FIGS. 5A-5E, the horizontal axis represents the frequencies of the harmonics and the vertical axis represent the amplitude. FIGS. 5B-5E show the frequency of the first signal from FIG. 5A after the spurious frequency attenuation servo begins operating. The fundamental frequency contained in first signal 61 generated by function generator 51 is indicated at arrow designated $1^{st}$. The fundamental frequency is generated at the first harmonic of the first signal 61. The other arrows designated $2^{nd}$, $3^{rd}$, $4^{th}$ and $5^{th}$ represent the second, third, fourth and fifth harmonics and indicate the spurious signals (spurs) generated along with the first signal 61. The arrow designated $n^{th}$ represents all of the spurs higher than the fifth harmonic. In operation, the first signal 61 is first sent through a first filter 60. In one implementation of this embodiment, the first filter 60 is a fixed HF-LPF. In some implementations of this embodiment, the SSB mixer would cause a large fifth harmonic to corrupt the third harmonic, a large sixth harmonic to corrupt the fourth harmonic, and so on. Thus, the fixed HF-LPF 60 allows for attenuation of $5^{th}$ and higher spurs ($n^{th}$), as shown in FIG. 5B.

The feedback signal 11 is sent to the SSB mixer 20. An SSB mixer first mixes the frequencies of two signals that result in a sum and difference of the frequencies of the two signals, and then outputs the sum or the difference of those frequencies. In one implementation of this embodiment, the two signals are both a copy of feedback signal 11 so that signal 11 is mixed with itself. In one implementation of this embodiment, the SSB mixer 20 outputs a DC signal representing a difference of the frequencies within the signal that it processed. In one implementation of this embodiment, the signal output from the SSB mixer 20 is a lower sideband of signal 11. One embodiment of an exemplary SSB mixer is described in more detail below with respect to FIG. 2.

As shown in FIG. 1, in one implementation of this embodiment, signal 14 is received by second filter 30. In one implementation of this embodiment, the second filter 30 filters out signal 14 and outputs a signal 15 such that signal 15 includes only the spurs generated along with first signal 61. After passing through the second filter 30, signal 15 is input into spur attenuation controller 40. In one implementation of this embodiment, the attenuation servo 100 includes an amplifier placed directly after second filter 30. Signal 15 passes through this amplifier before being input into spur attenuation controller 40 and the amplifier amplifies the spurs that remain in signal 15. In one implementation, signal 15 passes through an analog to digital (A/D) convertor before it is received by the spur attenuation controller 40. This A/D convertor is placed between the second filter 30 and the spur attenuation controller 40. One embodiment of an exemplary spur attenuation controller is discussed in more detail below with respect to FIG. 3.

The spur attenuation controller 40 accumulates the error in signal 15 and keeps integrating until the error term is driven to zero. In one implementation, the spur attenuation controller 40 also includes a filter so that all other spurs except for the unwanted spur at its respective frequency are filtered out. Spur attenuation controller outputs signal 16, which is received by a spur killer 50.

Spur killer 50 cancels out the spur that remains in signal 16. To cancel out the spur, signal 16 is mixed with a desired harmonic frequency and summed with first signal 61 to output a difference of the two. In one implementation of this embodiment, spur killer 50 is a commercial-off-the-shelf (COTS) direct digital synthesizer (DDS) with an internal spur killing device. The internal spur killing device has built-in final multipliers and summers required in operation of an attenuation servo, such as servo 100. Such a DDS also provides the matched frequencies of the harmonics. In one implementation of this embodiment, the spur killer 50 is the device AD9912 by Analog Devices. One embodiment of another exemplary spur killer is discussed in more detail below with respect to FIG. 4.

The output of spur killer 50, signal 17, is sent through first filter 60 so that the first signal 61 is yet again filtered out at a cut off frequency set in first filter 60. The output of first filter 60 is fed back as feedback signal 11 into the SSB mixer 20, and is simultaneously sent out to the system as output signal 18. The process keeps repeating until the unwanted spur has been canceled out. As discussed below with respect to FIG. 6, this process is repeated in a similar manner for a plurality of unwanted spurs.

Figure 2:
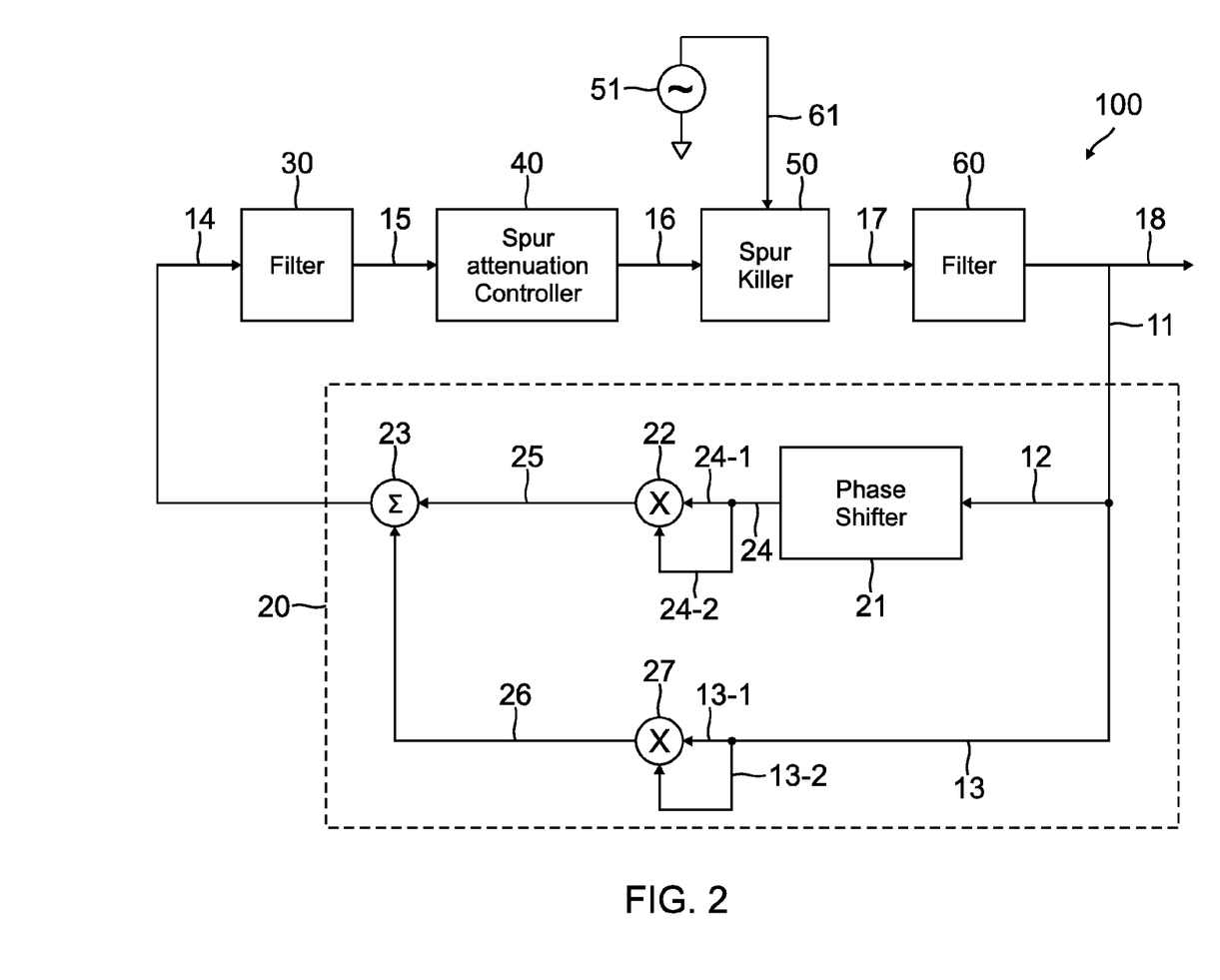
FIG. 2 is an example of a single side band mixer (SSB) included in an embodiment of a spurious frequency attenuation servo in accordance with the present invention.

FIG. 2 is an example of an SSB mixer 20 which can be implemented within an attenuation servo, such as servo 100 described in FIG. 1. The fundamental frequency within the first signal 61 generated by the first function generator 51 is very large and needs to be removed in order for the spurs within the signal to be attenuated by the servo. In one implementation of this embodiment, the signal sent into the SSB mixer cancels the higher band frequency which is the sum of the two mixed signals. The difference of the two mixed signals remains and is always at a direct current (DC) which can be filtered out by a LF-HPF. The spurs remaining in the output of the SSB mixer can be later amplified for effective attenuation.

In one implementation of this embodiment, the SSB mixer 20 includes a phase shifter 21, an inner mixer 22, a second inner mixer 27, and a summing node 23. The SSB mixer 20 also includes two incoming paths, first path 12 and second path 13, and signal 11 is received by the SSB mixer 20 via the first path 12 and the second path 13. As shown in FIG. 2, signal 11 sent via path 12 is input into phase shifter 21. Phase shifter 21 outputs signal 24. In one implementation of this embodiment, phase shifter 21 offsets signal 24 from signal 11 by 90 degrees. Signal 24 is then input into a first inner mixer 22 along two paths 24-1 and 24-2 such that signal 24 is mixed with itself. The first inner mixer 22 outputs a signal 25. Signal 25 includes a sum and difference of signal 24 mixed with itself. Signal 11 is also sent via path 13 and is input into a second inner mixer 27 along two paths 13-1 and 13-2 such that signal 11 mixes with itself. The second inner mixer 27 outputs a signal 26. Signal 26 includes the sum and difference of signal 11 mixed with itself. Signal 25 and signal 26 are then input into a summing node 23. In one implementation of this embodiment, summing node 23 is configured to output only the difference of the two frequencies of signal 25 and signal 26 such that signal 14, the resulting output of summing node 23, is a direct current (DC) signal with spurs.

Figure 5C:
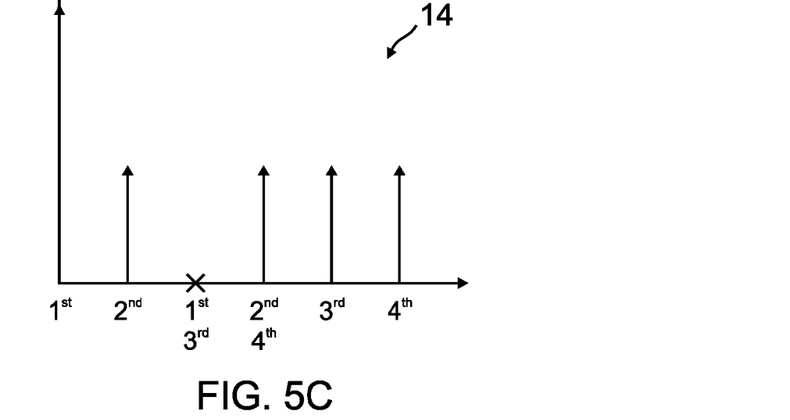

FIG. 5C shows the frequencies of FIG. 5A after the signal is passed through the SSB mixer. The frequencies of the first signal 61 represented generally as signal 14 output from the SSB mixer is shown in FIG. 5C. The SSB mixer produces the sum and difference of the first signal mixed with itself as shown in FIG. 5C on either side of the $2^{nd}$ harmonic. As shown in the example of FIG. 5C, because of the single sideband process, in one implementation of this embodiment, the upper sideband (on the right side of the $2^{nd}$ harmonic) is canceled out, and only the lower side band of the first frequency (the DC signal) and all of the other spurs including $2^{nd}$-$n^{th}$ harmonics are output in signal 14. In an implementation of this embodiment, where first filter 60 is a fixed HF-LPF, signal 14 includes the DC signal and only the $2^{nd}$, $3^{rd}$ and $4^{th}$ harmonic.

Figure 5D:
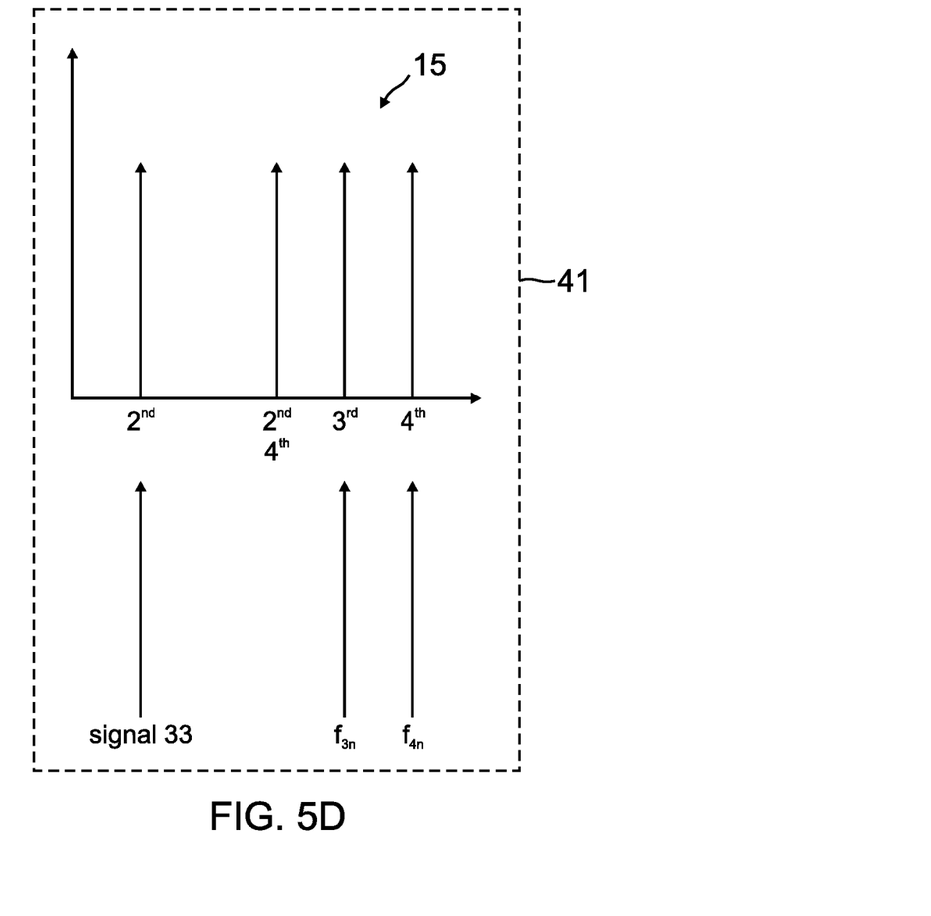

Signal 14 is received by second filter 30. FIG. 5D shows the frequencies of FIG. 5A after the signal has passed through second filter 30. FIG. 5D is an example of signal 15. In the example shown in FIG. 5D, the second filter 30 is a fixed LF-HPF. The cut off frequency of this fixed LF-HPF is set to filter out all frequencies lower than the one at the second harmonic. As shown in FIG. 5D, after going through the LF-HPF, the fundamental frequency (the DC portion) is filtered out and the resulting signal 15 includes only the spurs ($2^{nd}$-$4^{th}$ harmonic). Signal 15 is received by the spur attenuation controller 40.

Figure 3:
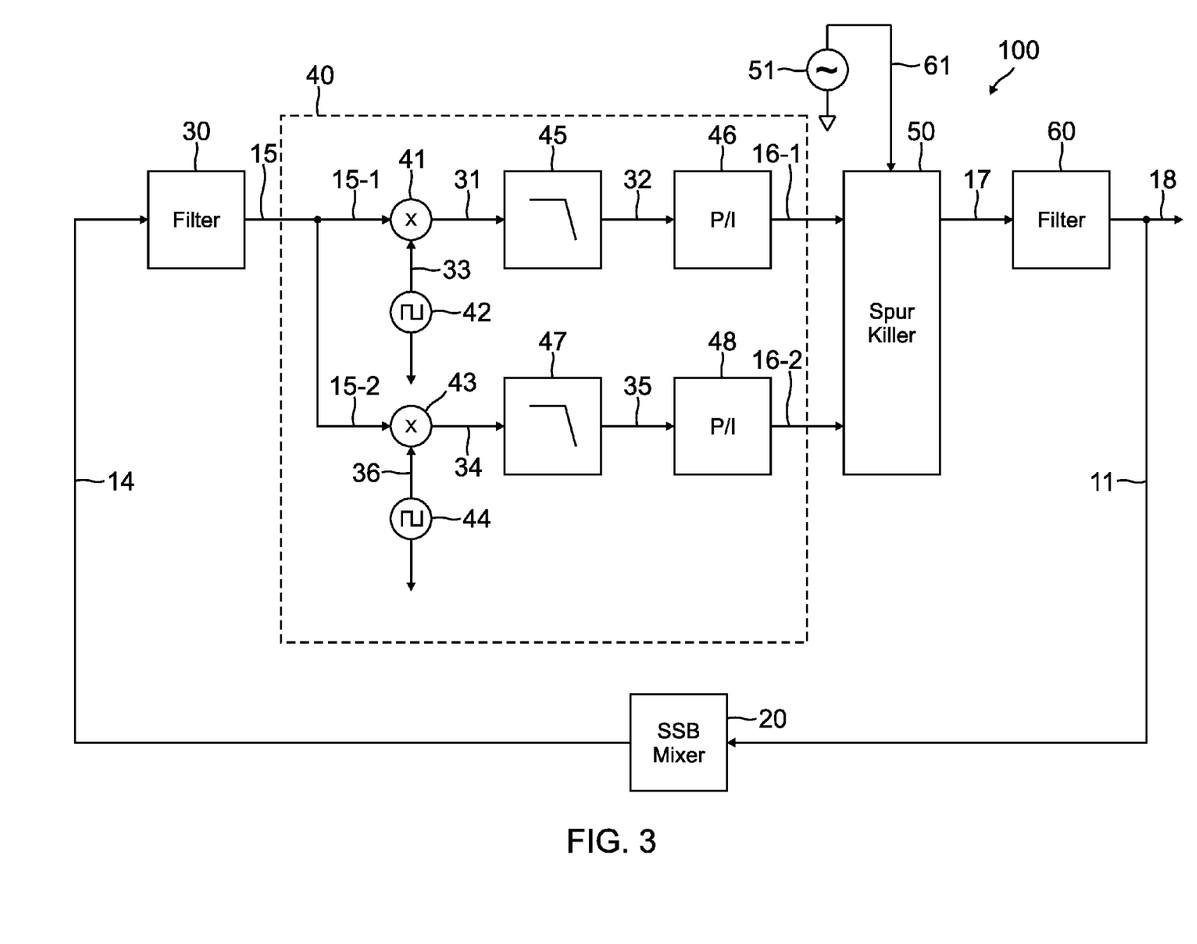
FIG. 3 is an example of a spur attenuation controller included in an embodiment of a spurious frequency attenuation servo in accordance with the present invention.

FIG. 3 is an example of a spur attenuation controller 40 which can be implemented within the attenuation servo 100. In some implementations, an attenuation servo will include multiple spur attenuation controllers, each spur attenuation controller operating on a different spur generated at a respective spurious frequency. FIG. 3 describes how such a spur attenuation controller would operate on one spur. As shown in FIG. 3, signal 15 is sent to a plurality of mixers, an in-phase mixer 41 via path 15-1 and to a quadrature-phase mixer 43 via path 15-2. Signal 33 generated by a second function generator 42 is also input into in-phase mixer 41 (also shown in FIG. 5D). In one implementation of this embodiment, the second function generator 42 is configured to generate a signal 33 at the fundamental frequency, which is the first signal. In one implementation of this embodiment, signal 33 is a digital square wave of the first signal 61. In one implementation of this embodiment, signal 33 is a digital sine wave of the first signal 61. In yet another implementation of this embodiment, signal 33 is an analog square wave of the first signal 61. In still another implementation of this embodiment, signal 33 is an analog sine wave of the first signal 61.

Figure 5E:
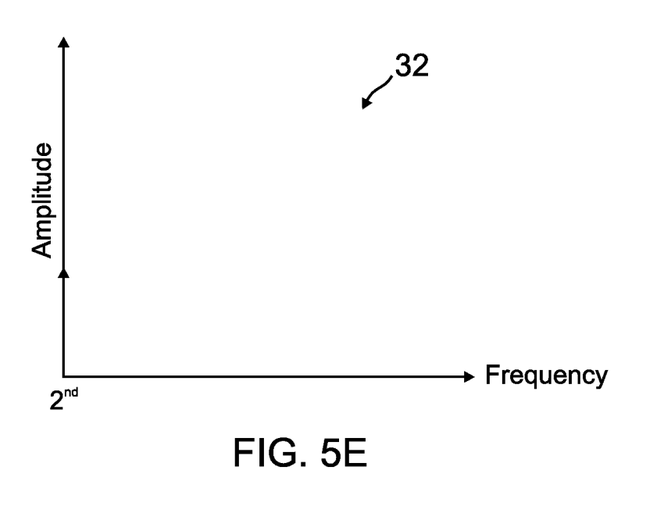

In one implementation of this embodiment, the resulting output signal 31 of in-phase mixer 41 is sent to filter 45. Filter 45 described in this embodiment does not have to be tuned. In one implementation of this embodiment, filter 45 is a fixed low pass filter. The fixed low pass filter allows the frequencies lower than the cut off frequency to pass through and filters out all of the frequencies higher than the cut off frequency. FIG. 5E shows an exemplary representation of the frequencies of the harmonics of FIG. 5A after having gone through filter 45. In the example shown in FIG. 5E, mixer 41 is configured to output the sum and difference of the signals that it mixes. Also, in the example shown in FIG. 5E, filter 45 is a fixed low pass filter with a cut off frequency set to include only the second harmonic which is the difference of the mixed signals. Thus, as shown in FIG. 5E, all of the higher spurs except for the one at the second harmonic have been filtered out. This filtered signal 32 is then sent to an in-phase proportional/integrator (P/I) controller 46.

Turning back to FIG. 3, signal 15 is also sent to a quadrature phase mixer 43 via path 15-2 where it mixes with signal 36 generated by a third function generator 44. The third function generator 43 generates a signal 36, which is a negative 90 degree phase shift of signal 33. In one implementation of this embodiment, the resulting output signal 34 is sent to filter 47. In one implementation of this embodiment, filter 47 is a low pass filter. The filtered signal 35 is then sent to a quadrature phase P/I controller 48.

Signal 32 and signal 35 include an error term which is read by P/I controllers 46 and 48 respectively. The P/I controllers such as the ones used in servo 100 accumulate the error and keep integrating until the error term is driven to zero. The P/I controller has two components: the integrating term of the P/I controller that drives the error term to zero and the proportional term that maintains the error to zero. The in-phase P/I controller 46 will stop integrating when output 16-1 from the in-phase P/I controller 46 has zero error such that it matches the value of the in-phase component of the second harmonic. Similarly, the quadrature phase P/I controller 48 will stop integrating when the output 16-2 from the quadrature phase P/I controller 48 has zero error such that it matches the value of the quadrature-phase component of the second harmonic.

When signal 16-1 generated by the in-phase P/I controller 46 has a value of zero and signal 16-2 generated by the quadrature phase P/I controller 48 also has a value of zero, then signal 11 output from the servo 100 and fed back into the servo 100 has a value equal to first signal 61 output from the first function generator 51. If the value of signal 31 is zero, the in-phase error is zero. If the value of signal 34 is zero, the quadrature phase error is zero.

If the spur to be canceled in the first signal 61 generated by the first function generator 51 has an in-phase component, then signal 31, the output of the in-phase mixer 41, is not zero. The non-zero error is accumulated by the in-phase P/I controller 46 and signal 16-1 represents the in-phase magnitude needed to set signal 32 to zero. Similarly, if the spur to be canceled in the first signal 61 generated by the first function generator 51 has a quadrature phase component, then signal 34, the output of the in-phase mixer 41, is not zero. This non-zero error is accumulated by the quadrature phase P/I controller 48 and signal 16-2 represents the quadrature phase magnitude needed to set signal 35 to zero.

Figure 4:
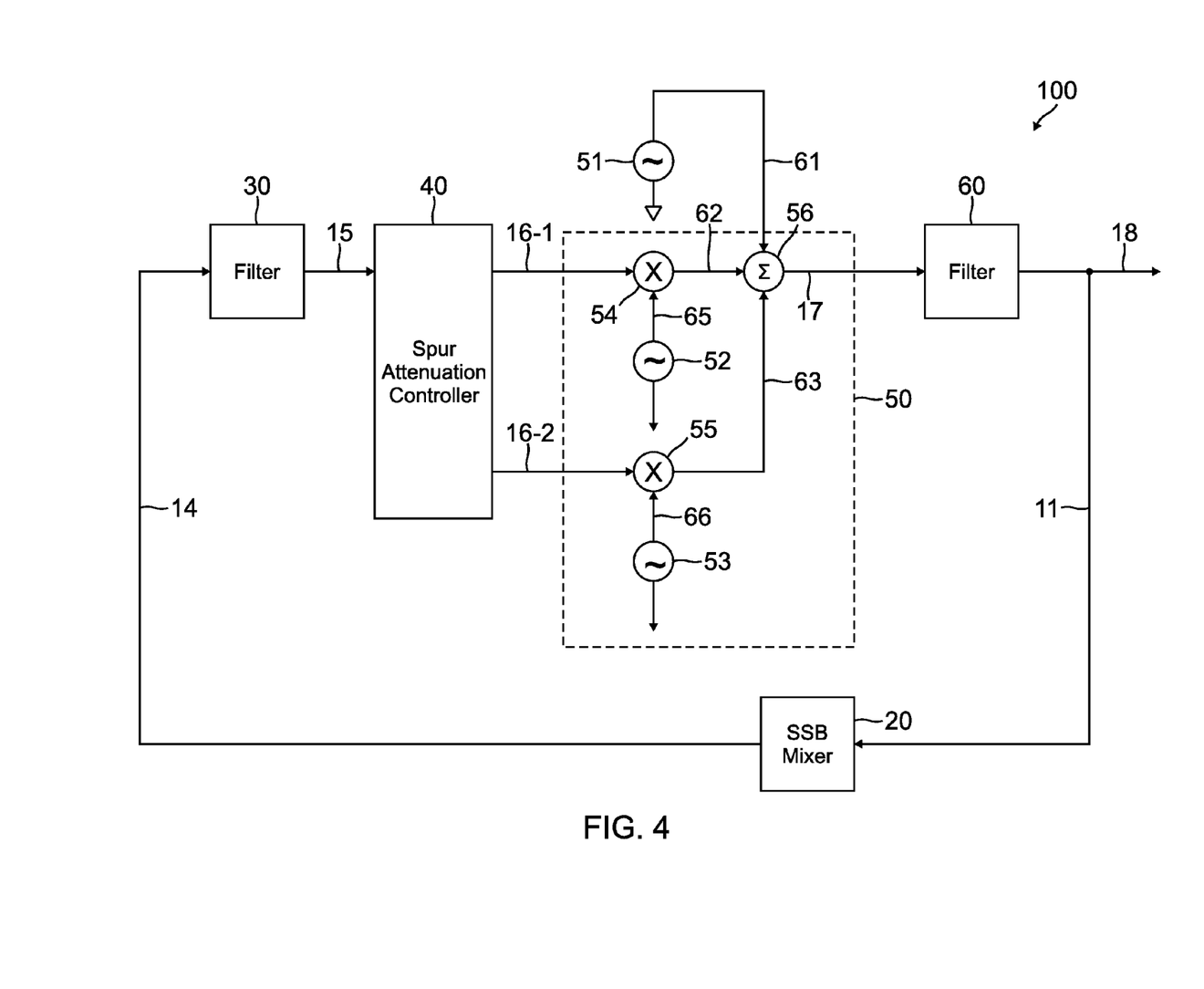
FIG. 4 is an example of a spur killer included in an embodiment of a spurious frequency attenuation servo in accordance with the present invention.

As discussed above, the P/I controller output signal 16 is then input into a spur killer 50. FIG. 4 is an example of a spur killer 50 that could be implemented in attenuation servo 100. As shown in FIG. 4, signal 16-1, the in-phase component output from P/I controller 46 is sent into an in-phase multiplier 54. A fourth function generator 52 generates a signal 65 that is sent to in-phase multiplier 54. In one implementation of this embodiment, signal 65 is a harmonic frequency supplied by a COTS DDS. Function generator 52 is set to generate a harmonic frequency dependent on the unwanted spur that is to be canceled by the respective spur attenuation controller within the attenuation servo. As discussed earlier in FIG. 3 with respect to spur attenuation controller, the P/I controller will keep integrating to drive the error term to zero so that signal 62 is equal and opposite to the in-phase harmonic frequency that is generated by function generator 51. The in-phase multiplier output signal 62 is then sent to a summing node 56.

The quadrature component of the spur killer 60 works in a similar manner. As shown in FIG. 4, signal 16-2 is multiplied with signal 66 generated by fifth function generator 53 via a quadrature multiplier 55. In one implementation of this embodiment, signal 66 is a negative 90 degrees phase shift of signal 65. Signal 63, output from the quadrature multiplier 55 is equal and opposite to the quadrature phase harmonic frequency generated by function generator 51 and is sent to summing node 56. Summing node 56 sums signal 62, signal 63 and the first signal 61. The output of the spur attenuation controller determines the result of signal 62 and signal 63. The spur killer 50 sums signal 62 and 63 back with first signal 61 to yield a correction signal 17 that will go back into the servo and allow spur attenuation controller 40 to check if the error term included in signal 15 as input into the spur attenuation controller 40 has been driven to zero. The spur attenuation controller 40 will keep integrating based on the correction signal 17 sent back into the servo to continuously drive the error term to zero, and the respective unwanted spur has been eliminated. In an implementation of this embodiment where a plurality of spurs is generated by first function generator 51 along with the first signal 61, signal 65, the output of the summing node 56, is then sent to another summing node 57 (See FIG. 6).

Figure 6:
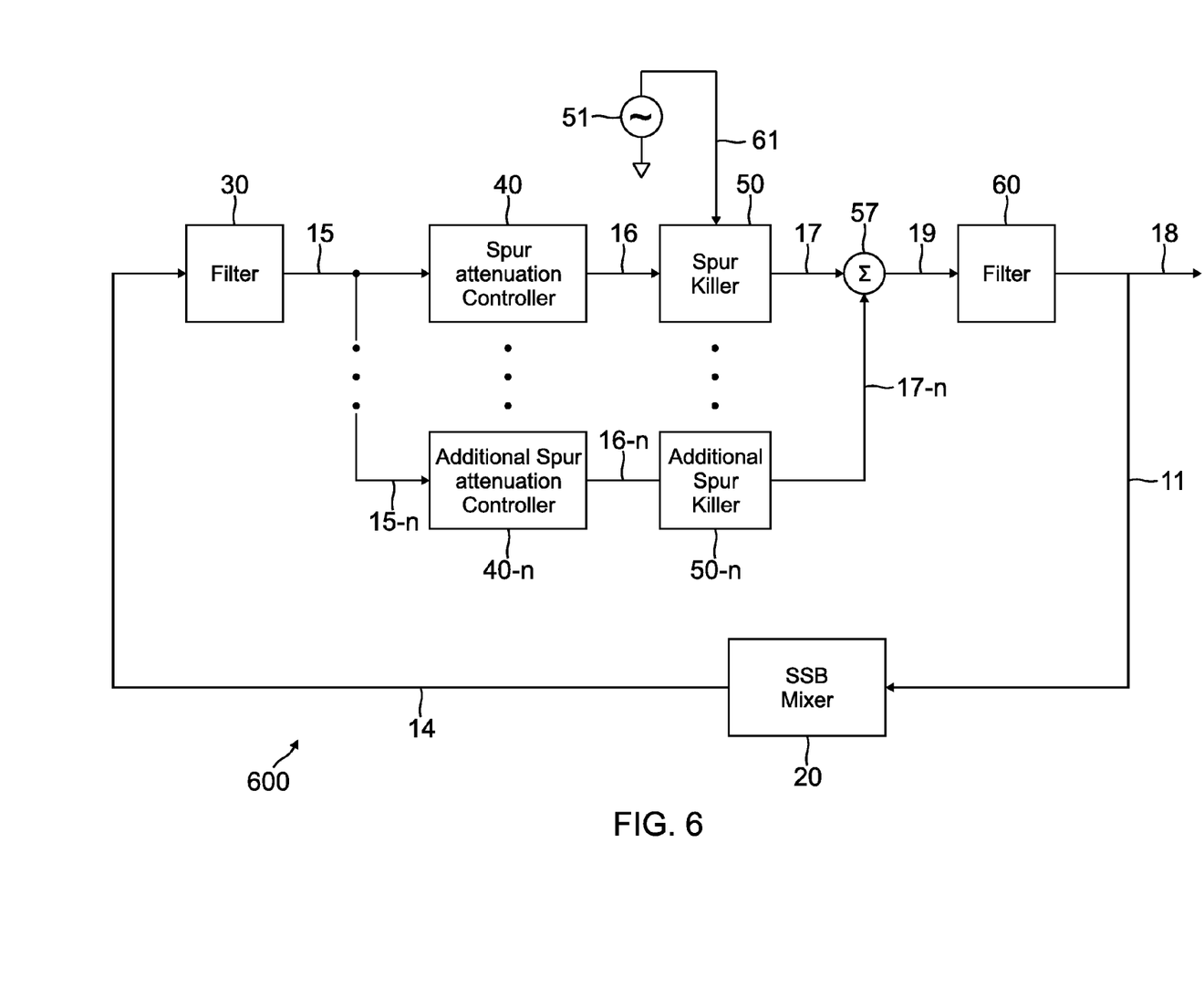
FIG. 6 is an exemplary embodiment of a spurious frequency attenuation servo to remove more than one spur from the first signal shown in FIG. 5A.

FIG. 6 is an example of servo 600 to remove a plurality of spurs at a respective plurality of spurious frequencies from the first signal 61 generated by the first function generator 51. In one implementation of this embodiment, spur killer 20 comprises first function generator 51. As shown in FIG. 6, signal 15 is input into additional spur attenuation controller 40-n via path 15-n. Additional spur attenuation controller 40-n works in a manner similar to the spur attenuation controller 40 of FIG. 1. In one implementation of this embodiment, where the fifth and higher harmonics have been filtered out by first filter 60, the additional spur attenuation controller 40-n only drives the $3^{rd}$ and the $4^{th}$ harmonics to zero. In one implementation of this embodiment, each spur attenuation controller includes low pass filters like filters 45 and 47 of the attenuation servo described in FIG. 1. In one implementation of this embodiment the cut-off frequency of these low pass filters is set to include only the harmonic driven by the spur attenuation controller 40-n.

As shown in FIG. 6, signal 16-n, the output from the additional spur attenuation controller 40-n, is input into additional spur killer 50-n. Additional spur killer 50-n works in a manner similar to spur killer 50 of FIG. 1. As shown in FIG. 6, once the in-phase output from the in-phase multiplier of additional spur killer 50-n and quadrature phase output from the quadrature phase multiplier of additional spur killer 50-n have been summed, signal 17-n the output of the additional spur killer 50-n and correction signal 17 output from spur killer 50 are input into summing node 57. Summing node 57 sums the outputs from all spur killers within attenuation servo 100. The sum of the output of all the spur killers 50-1 . . . 50-n, signal 19, is then sent to the first filter 60. The filtered signal is then sent back as feedback signal 11 into SSB mixer 20 as well as out to the system as signal 18, and the process described in FIG. 6 is repeated. The process described in FIG. 6 is repeated until each unwanted spur at each of the respective spurious frequencies is eliminated.

Figure 7:
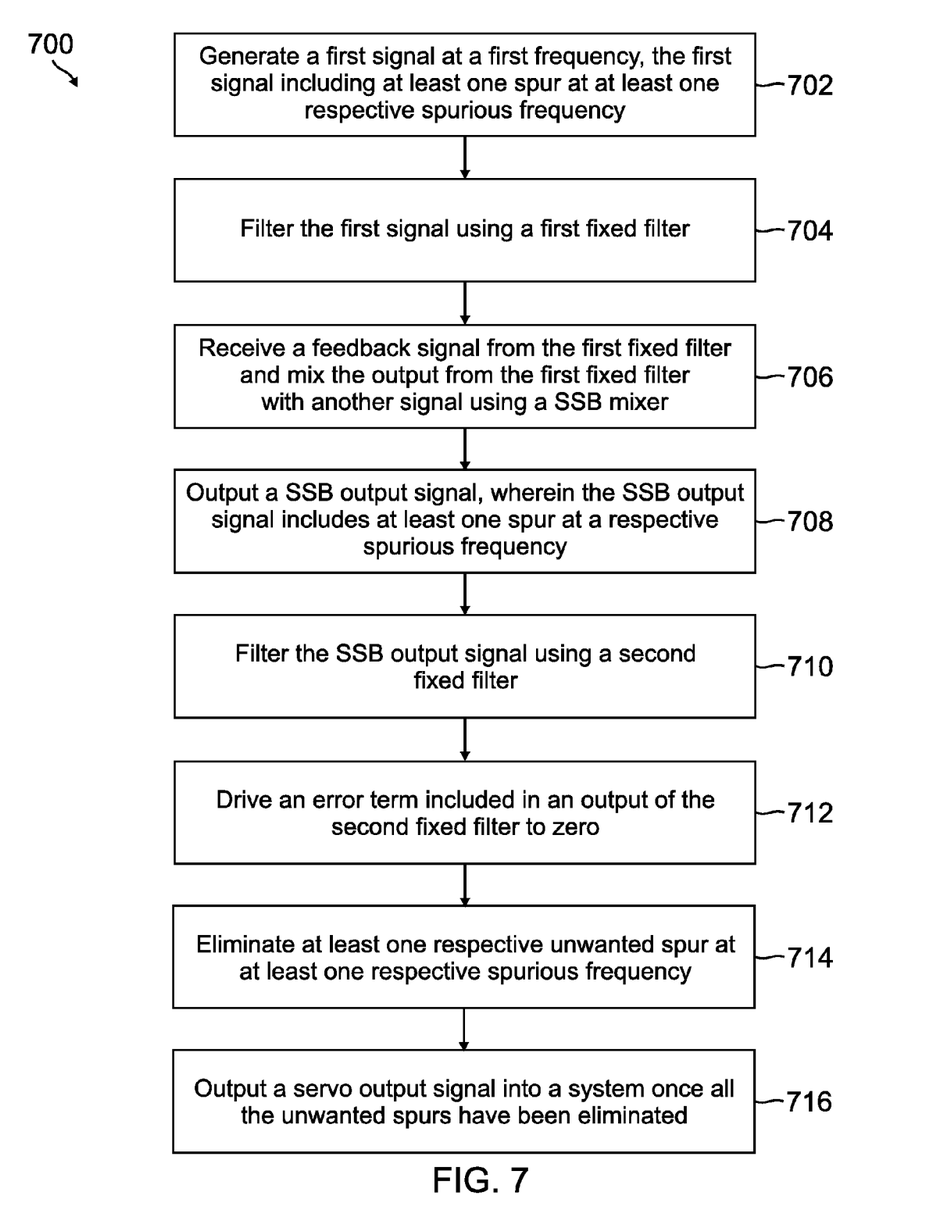
FIG. 7 is a flow chart depicting one embodiment of an exemplary method of cancelling one or more spurs in a spurious frequency attenuation servo without tuning a filter.

FIG. 7 is a method 700 of cancelling one or more spurs in a spurious frequency attenuation servo, such as spurious frequency attenuation server 100 or spurious frequency attenuation server 600. At block 702, a first signal is generated at a first frequency. The first signal includes at least one spur at one respective spurious frequency. At block 704, the first signal is filtered by a first filter. In one implementation of this method, the first filter is a fixed high frequency low pass filter (HF-LPF) so that the spurs generated at higher harmonics than a desired cut off frequency are filtered out. At block 706, an SSB mixer receives the feedback signal output from the first filter and mixes the feedback signal with another signal. In one implementation of this method, the other signal is the feedback signal. At block 708, the SSB mixer outputs a SSB output signal that includes a sum or a difference resulting from mixing the filtered first signal with another signal. The SSB output signal includes at least one spur at a respective spurious frequency. In one implementation of this method, the SSB mixer is configured to output a direct current (DC) signal. The DC signal includes at least one spur at a respective spurious frequency.

At block 710, the SSB output signal is filtered by a second filter 30. In one implementation of this method, the second filter 30 is a fixed low frequency high pass filter so everything except for the spurs that remain in the SSB signal is filtered out. At block 712, an error term included in an output of the second fixed filter is driven to zero. In one implementation of this method, the error term is read, accumulated and integrated to be driven to zero. In one implementation of this embodiment, the spur killer 50 yields a correction signal that is sent back to the servo to determine if the error term has been driven to zero.

At block 714, a respective unwanted spur at at least one respective spurious frequency is eliminated. At block 716, all the unwanted spurs generated with the first signal are eliminated using the method described herein and the servo output signal is sent out to a system.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof.

Example Embodiments

Example 1 includes a spurious frequency attenuation servo, comprising: a first function generator that generates a first signal at a first frequency, wherein the first signal includes at least one spur at at least one respective spurious frequency; a first fixed filter that receives the first signal; a single sideband (SSB) mixer coupled to the first fixed filter to receive an output of the first fixed filter, wherein the SSB mixer is configured to output a SSB output signal that includes the at least one spur at the at least one respective spurious frequency, the SSB output comprising one of a sum or a difference of frequencies of the output of the first filter and another signal mixed with the output of the first filter; a second fixed filter, wherein the second filter receives the SSB output signal including the at least one spur at at least one respective spurious frequency, and wherein the second fixed filter is further configured to filter the SSB output signal and output the at least one spur at the at least one respective spurious frequency; at least one spur attenuation controller, wherein the at least one spur attenuation controller is configured to accumulate error after reading an error term in the at least one spur at the at least one respective spurious frequency and to keep integrating until the error term is driven to zero; and at least one spur killer configured to remove the at least one spur at the at least one respective spurious frequency when the error term is driven to zero.

Example 2 includes the spurious frequency attenuation servo of Example 1, wherein the SSB mixer further comprises: a first path including a phase shifter configured to shift the phase of a first copy of the output of the first filter; and a first inner mixer that mixes an output of the phase shifter with itself; a second path including a second inner mixer that mixes a second copy of the output of the first filter with itself; and a first summing node, wherein the summing node sums an output of the first inner mixer and an output of the second inner mixer.

Example 3 includes the spurious frequency attenuation servo of Example 2, wherein the output of the summing node includes only a difference of the output of the first inner mixer and the second inner mixer.

Example 4 includes the spurious frequency attenuation servo of Examples 1-3, wherein the second filter is a fixed low frequency high-pass filter (LF-HPF).

Example 5 includes the spurious frequency attenuation servo of Examples 1-4, wherein the first filter is a fixed high frequency low pass filter (HF-LPF).

Example 6 includes the spurious frequency attenuation servo of Example 1-5, wherein the spur attenuation controller further comprises at least one in-phase mixer, at least one quadrature phase mixer, a second function generator, a third function generator, an in-phase proportional/integrator (P/I) controller, and a quadrature phase P/I controller.

Example 7 includes the spurious frequency attenuation servo of Example 6, wherein the second function generator generates a second signal which is a digital square wave of the first signal, and wherein the third function generator generates a third signal which is a negative ninety degrees phase shift of the second signal.

Example 8 includes the spurious frequency attenuation servo of Example 1, wherein the at least one spur attenuation controller further comprises at least one fixed low pass filter.

Example 9 includes the spurious frequency attenuation servo of Example 1-8, wherein the at least one spur killer is a commercial-off-the-shelf (COTS) direct digital synthesizer (DDS) comprising an internal spur killing device.

Example 10 includes the spurious frequency attenuation servo of Examples 1-9, wherein the at least one spur killer comprises an in-phase multiplier, a quadrature phase multiplier, a fourth function generator, a fifth function generator and a second summing node.

Example 11 includes the spurious frequency attenuation servo of Example 10, wherein the fourth function generator generates a fourth signal at the harmonic frequency configured to match the spurious frequency at which the at least one spur is generated, and wherein the fifth function generator generates a fifth signal which is a negative ninety degrees phase shift of the fourth signal.

Example 12 includes the spurious frequency attenuation servo of Examples 1-11, further comprising an analog-to-digital (A/D) convertor.

Example 13 includes the spurious frequency attenuation servo of Examples 1-12, further comprising an amplifier placed between the first filter and the at least one spur attenuation controller.

Example 14 includes the spurious frequency attenuation servo of Examples 1-13, wherein the SSB output signal is a direct current (DC) signal including at least one spur.

Example 15 includes the spurious frequency attenuation servo of Examples 1-14, further comprising a third summing node that receives the output from the at least one spur killer and an output from additional spur killers in the spurious frequency attenuation servo.

Example 16 includes a method of cancelling one or more spurs in a spurious frequency attenuation servo without tuning a filter, the method comprising: generating a first signal at a first frequency, the first signal including at least one spur at at least one respective spurious frequency; filtering the first signal at a first cut-off frequency using a first fixed filter; mixing the filtered first signal with another signal in a single sideband (SSB) mixer; outputting a signal from the SSB mixer which includes either a sum or a difference resulting from mixing the filtered first signal with another signal, the SSB output signal including the at least one spur at the at least one respective spurious frequency; filtering the SSB output signal at a second cut off frequency using a second fixed filter configured to output the at least one spur at the at least one respective spurious frequency; driving an error term included in an output of the second fixed filter to zero; and eliminating the at least one spur at the at least one respective spurious frequency once the output of the second fixed filter is driven to zero.

Example 17 includes the method of Example 16, wherein mixing the filtered first signal with another signal further comprises: shifting the phase of a first copy of the filtered first signal, and mixing the phase shifted filtered first signal with itself to produce a first path signal; mixing a second copy of the filtered first signal with itself to produce a second path signal; and summing the first path signal with the second path signal to produce a the SSB output signal representing a difference between the first path signal and the second path signal.

Example 18 includes the method of Example 16-17, wherein driving an error term included in an output of the second fixed filter to zero further comprises: multiplying an output of an in-phase component of a spur attenuation controller with a second signal generated by a second function generator via an in-phase multiplier; multiplying an output of a quadrature phase component of the spur attenuation controller with a third signal generated by a third function generator via a quadrature phase multiplier; yielding a correction signal by summing the output of the in-phase multiplier, the output of a quadrature phase multiplier and the first signal; sending the correction signal through the first fixed filter, the SSB mixer, the second fixed filter, and the spur attenuation controller; and reading, accumulating, and integrating the error term in the filtered correction signal using the spur attenuation controller.

Example 19 includes the method of Example 16-18, wherein eliminating the at least one spur at the at least one respective spurious frequency further comprises: multiplying an output of an in-phase component of a spur attenuation controller, wherein the output of an in-phase component of a spur attenuation controller matches with a second signal generated by a second function generator via an in-phase multiplier; multiplying an output of a quadrature phase component of the spur attenuation controller, wherein the output of the quadrature phase component of the spur attenuation controller matches with a third signal generated by a third function generator via a quadrature phase multiplier; and summing the output of the in-phase multiplier, the output of a quadrature phase multiplier and the first signal.

Example 20 includes a spurious frequency attenuation servo, comprising: a direct digital synthesizer (DDS), wherein the DDS generates a first signal at a first frequency, wherein the first signal includes at least one spur at at least one spurious frequency; a first fixed filter, wherein the first fixed filter filters out all of the frequencies higher than a first cut-off frequency; a single sideband (SSB) mixer coupled to the first fixed filter, wherein the SSB mixer is configured to output a direct current (DC) signal based on an output of the first fixed filter, the DC signal including the at least one spur at the at least one spurious frequency; a second fixed filter, wherein the second fixed filter receives the DC signal including the at least one spur at the at least one spurious frequency, and wherein the second fixed filter is further configured to filter out the DC signal and output the at least one spur at the at least one spurious frequency; an amplifier positioned after the second fixed filter that amplifies the output from the second fixed filter; at least one in-phase mixer that mixes the amplified output with a digital square wave of the first signal; at least one in-phase fixed low pass filter that filters an output from the at least one in-phase mixer to include the at least one spur at the at least one respective spurious frequency; at least one in-phase proportional/integration (P/I) controller, wherein the in-phase P/I controller reads, accumulates and integrates an error term in an in-phase component of at least one spur at the at least one respective spurious frequency until the error term in the in-phase component is driven to zero; at least one in-phase multiplier that multiplies a harmonic frequency supplied by the DDS with an output of the at least one in-phase P/I controller; at least one quadrature-phase mixer that mixes the amplified output with a phase shift of a digital square wave of the first signal; at least one quadrature-phase fixed low pass filter that filters an output from the at least one quadrature-phase mixer to include the at least one spur at the at least one respective spurious frequency; at least one quadrature-phase proportional/integration (P/I) controller, wherein the quadrature phase P/I controller reads, accumulates and integrates an error term in a quadrature-phase component of at least one spur at the at least one respective spurious frequency until the error term in the quadrature-phase component is driven to zero; at least one quadrature-phase multiplier that multiplies a phase shift of the harmonic frequency supplied by the DDS with an output of the at least one quadrature-phase P/I controller; at least one summing node that sums the output of the at least one in-phase multiplier, the at least one quadrature phase multiplier and the first signal; and a correction signal output from the at least one summing node, wherein the correction signal is used to determine if the error term in-phase component of at least one spur at the at least one respective spurious frequency and the error term in quadrature phase component of at least one spur at the at least one respective spurious frequency has been driven to zero.

What is claimed is:

1. A spurious frequency attenuation servo, comprising:
a first function generator that generates a first signal at a first frequency, wherein the first signal includes at least one spur at at least one respective spurious frequency;
a first fixed filter that receives the first signal;
a single sideband (SSB) mixer coupled to the first fixed filter to receive an output of the first fixed filter, wherein the SSB mixer is configured to output a SSB output signal that includes the at least one spur at the at least one respective spurious frequency, the SSB output comprising one of a sum or a difference of frequencies of the output of the first filter and another signal mixed with the output of the first filter;
a second fixed filter, wherein the second filter receives the SSB output signal including the at least one spur at at least one respective spurious frequency, and wherein the second fixed filter is further configured to filter the SSB output signal and output the at least one spur at the at least one respective spurious frequency;
at least one spur attenuation controller, wherein the at least one spur attenuation controller is configured to accumulate error after reading an error term in the at least one spur at the at least one respective spurious frequency and to keep integrating until the error term is driven to zero; and
at least one spur killer configured to remove the at least one spur at the at least one respective spurious frequency when the error term is driven to zero.

2. The spurious frequency attenuation servo of claim 1, wherein the SSB mixer further comprises:
a first path including a phase shifter configured to shift the phase of a first copy of the output of the first filter; and a first inner mixer that mixes an output of the phase shifter with itself;
a second path including a second inner mixer that mixes a second copy of the output of the first filter with itself; and
a first summing node, wherein the summing node sums an output of the first inner mixer and an output of the second inner mixer.

3. The spurious frequency attenuation servo of claim 2, wherein the output of the summing node includes only a difference of the output of the first inner mixer and the second inner mixer.

4. The spurious frequency attenuation servo of claim 1, wherein the second filter is a fixed low frequency high-pass filter (LF-HPF).

5. The spurious frequency attenuation servo of claim 1, wherein the first filter is a fixed high frequency low pass filter (HF-LPF).

6. The spurious frequency attenuation servo of claim 1, wherein the spur attenuation controller further comprises at least one in-phase mixer, at least one quadrature phase mixer, a second function generator, a third function generator, an in-phase proportional/integrator (P/I) controller, and a quadrature phase P/I controller.

7. The spurious frequency attenuation servo of claim 6, wherein the second function generator generates a second signal which is a digital square wave of the first signal, and wherein the third function generator generates a third signal which is a negative ninety degrees phase shift of the second signal.

8. The spurious frequency attenuation servo of claim 1, wherein the at least one spur attenuation controller further comprises at least one fixed low pass filter.

9. The spurious frequency attenuation servo of claim 1, wherein the at least one spur killer is a commercial-off-the-shelf (COTS) direct digital synthesizer (DDS) comprising an internal spur killing device.

10. The spurious frequency attenuation servo of claim 1, wherein the at least one spur killer comprises an in-phase multiplier, a quadrature phase multiplier, a fourth function generator, a fifth function generator and a second summing node.

11. The spurious frequency attenuation servo of claim 10, wherein the fourth function generator generates a fourth signal at the harmonic frequency configured to match the spurious frequency at which the at least one spur is generated, and wherein the fifth function generator generates a fifth signal which is a negative ninety degrees phase shift of the fourth signal.

12. The spurious frequency attenuation servo of claim 1 further comprising of an analog-to-digital (A/D) convertor.

13. The spurious frequency attenuation servo of claim 1 further comprising:
an amplifier placed between the first filter and the at least one spur attenuation controller.

14. The spurious frequency attenuation servo of claim 1, wherein the SSB output signal is a direct current (DC) signal including at least one spur.

15. The spurious frequency attenuation servo of claim 1 further comprising:
a third summing node that receives the output from the at least one spur killer and an output from additional spur killers in the spurious frequency attenuation servo.

16. A method of cancelling one or more spurs in a spurious frequency attenuation servo without tuning a filter, the method comprising:
generating a first signal at a first frequency, the first signal including at least one spur at at least one respective spurious frequency;
filtering the first signal at a first cut-off frequency using a first fixed filter;
mixing the filtered first signal with another signal in a single sideband (SSB) mixer;
outputting a signal from the SSB mixer which includes either a sum or a difference resulting from mixing the filtered first signal with another signal, the SSB output signal including the at least one spur at the at least one respective spurious frequency;
filtering the SSB output signal at a second cut off frequency using a second fixed filter configured to output the at least one spur at the at least one respective spurious frequency;
driving an error term included in an output of the second fixed filter to zero; and
eliminating the at least one spur at the at least one respective spurious frequency once the output of the second fixed filter is driven to zero.

17. The method of claim 16, wherein mixing the filtered first signal with another signal further comprises:
shifting the phase of a first copy of the filtered first signal, and mixing the phase shifted filtered first signal with itself to produce a first path signal;
mixing a second copy of the filtered first signal with itself to produce a second path signal; and
summing the first path signal with the second path signal to produce a the SSB output signal representing a difference between the first path signal and the second path signal.

18. The method of claim 16, wherein driving an error term included in an output of the second fixed filter to zero further comprises:
multiplying an output of an in-phase component of a spur attenuation controller with a second signal generated by a second function generator via an in-phase multiplier;
multiplying an output of a quadrature phase component of the spur attenuation controller with a third signal generated by a third function generator via a quadrature phase multiplier;
yielding a correction signal by summing the output of the in-phase multiplier, the output of a quadrature phase multiplier and the first signal;
sending the correction signal through the first fixed filter, the SSB mixer, the second fixed filter, and the spur attenuation controller; and
reading, accumulating, and integrating the error term in the filtered correction signal using the spur attenuation controller.

19. The method of claim 16, wherein eliminating the at least one spur at the at least one respective spurious frequency further comprises:
multiplying an output of an in-phase component of a spur attenuation controller, wherein the output of an in-phase component of a spur attenuation controller matches with a second signal generated by a second function generator via an in-phase multiplier;
multiplying an output of a quadrature phase component of the spur attenuation controller, wherein the output of the quadrature phase component of the spur attenuation controller matches with a third signal generated by a third function generator via a quadrature phase multiplier; and
summing the output of the in-phase multiplier, the output of a quadrature phase multiplier and the first signal.

20. A spurious frequency attenuation servo, comprising:
a direct digital synthesizer (DDS), wherein the DDS generates a first signal at a first frequency, wherein the first signal includes at least one spur at at least one spurious frequency;
a first fixed filter, wherein the first fixed filter filters out all of the frequencies higher than a first cut-off frequency;
a single sideband (SSB) mixer coupled to the first fixed filter, wherein the SSB mixer is configured to output a direct current (DC) signal based on an output of the first fixed filter, the DC signal including the at least one spur at the at least one spurious frequency;
a second fixed filter, wherein the second fixed filter receives the DC signal including the at least one spur at the at least one spurious frequency, and wherein the second fixed filter is further configured to filter out the DC signal and output the at least one spur at the at least one spurious frequency;
an amplifier positioned after the second fixed filter that amplifies the output from the second fixed filter;
at least one in-phase mixer that mixes the amplified output with a digital square wave of the first signal;
at least one in-phase fixed low pass filter that filters an output from the at least one in-phase mixer to include the at least one spur at the at least one respective spurious frequency;
at least one in-phase proportional/integration (P/I) controller, wherein the in-phase P/I controller reads, accumulates and integrates an error term in an in-phase component of at least one spur at the at least one respective spurious frequency until the error term in the in-phase component is driven to zero;
at least one in-phase multiplier that multiplies a harmonic frequency supplied by the DDS with an output of the at least one in-phase P/I controller;
at least one quadrature-phase mixer that mixes the amplified output with a phase shift of a digital square wave of the first signal;

at least one quadrature-phase fixed low pass filter that filters an output from the at least one quadrature-phase mixer to include the at least one spur at the at least one respective spurious frequency;

at least one quadrature-phase proportional/integration (P/I) controller, wherein the quadrature phase P/I controller reads, accumulates and integrates an error term in a quadrature-phase component of at least one spur at the at least one respective spurious frequency until the error term in the quadrature-phase component is driven to zero;

at least one quadrature-phase multiplier that multiplies a phase shift of the harmonic frequency supplied by the DDS with an output of the at least one quadrature-phase P/I controller;

at least one summing node that sums the output of the at least one in-phase multiplier, the at least one quadrature phase multiplier and the first signal; and a correction signal output from the at least one summing node, wherein the correction signal is used to determine if the error term in-phase component of at least one spur at the at least one respective spurious frequency and the error term in quadrature phase component of at least one spur at the at least one respective spurious frequency has been driven to zero.

* * * * *